April 30, 1968 J. L. WALSH 3,381,140

POWER AMPLIFIER UTILIZING CROSS-COUPLED CURRENT SWITCHES

Filed May 31, 1963

INVENTOR

JAMES L. WALSH

BY David N. Koffsky

ATTORNEY

United States Patent Office
3,381,140
Patented Apr. 30, 1968

3,381,140
POWER AMPLIFIER UTILIZING CROSS-COUPLED CURRENT SWITCHES

James L. Walsh, Hyde Park, N.Y., assignor to International Business Machines Corporation, New York, N.Y., a corporation of New York Filed May 31, 1963, Ser. No. 284,523
4 Claims. (Cl. 307—230)

This invention relates to power amplifier circuits, and more particularly to a transistor power amplifier utilizing cross-coupled current switches which requires a minimum input signal to provide a high power output.

Generally, when it is desired to achieve substantial power outputs from high speed transistor amplifiers, either of two courses may be attempted. First, a special high power transistor output stage can be provided, but this usually results in a sacrifice in speed due to the high inter-electrode capacitances which accompany these devices. Second, high speed transistors may be paralleled so as to achieve the required power levels. While the latter scheme does fulfill the power and speed requirements, it has a major drawback, in that, the base excitation current required from a previous stage is multiplied by the number of parallel output stages and may exceed its power generating capabilities. Thus, it may occur that while the power amplifier is sufficient to produce a desired output, there is insufficient driving current to excite the amplifier.

Accordingly, it is an object of this invention to provide a high speed power amplifier which requires a minimum of input excitation to provide a high power output.

It is another object of this invention to provide a high speed power amplifier which in addition to requiring minimum excitation provides both true and complement outputs.

It is still another object of this invention to provide a high speed power amplifier which in addition to requiring minimum excitation avoids saturation effects.

In accordance with the above stated objects, a power amplifier is provided which includes a plurality of current switches connected across true and complement output lines. Means are provided to interconnect the current switches in such a manner that when an input signal is received at one current switch, corresponding transistors of the remaining parallel connected current switches are simultaneously impulsed by power drawn from an output power supply rather than the input signal source.

The foregoing and other objects, features and advantages of the invention will be apparent from the following more particular description of the further embodiments of the invention as illustrated in the accompanying drawings.

Figure 1:
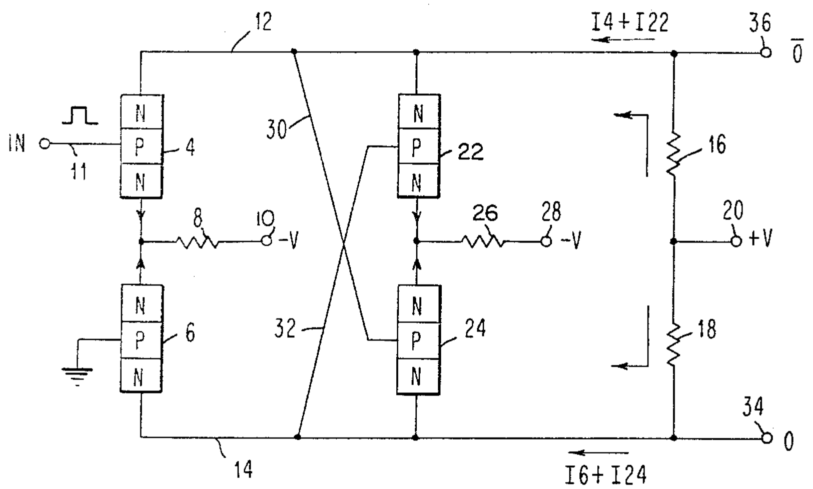
FIG. 1 is a circuit diagram of an embodiment of the invention.

Referring now to the circuit diagram of FIG. 1, the emitters of NPN transistors 4 and 6 are connected through resistor 8 to a source of negative potential 10. The base circuit of transistor 6 is grounded and base conductor 11 of transistor 4 is utilized as an input terminal for the circuit. The collectors or output terminals of transistors 4 and 6 are respectively connected through conductors 12 and 14 and resistors 16 and 18 to a source of positive potential 20. The circuit so far described is the well known current switch which is described in detail in U.S. Patent 2,964,652 issued to H. S. Yourke. The essence of the current switch's operation is seen by realizing that transistors 4 and 6 provide multiple current paths for the current emanating from positive potential source 20 and, dependent upon which one of the pair of transistors is conductive, current flows therethrough energizing its associated output conductor.

A second current switch which includes NPN transistors 22 and 24 is connected between conductors 12 and 14. The emitters of transistors 22 and 24 are connected in common through resistor 26 to source of negative potential 28. While transistors 22 and 24 correspond respectively to transistors 4 and 6 with regards to their collector or output terminals, the base circuits or input terminals of these transistors are cross-coupled through conductors 30 and 32 to conductors 12 and 14. The result of these connections is that the conductivity state of transistor 22 is controlled by the conductivity state of transistor 6 and the conductivity state of transistor 24 is conrolled by the conductivity state of transistor 4. The true and complement outputs from this circuit are taken from terminals 34 and 36, respectively.

In operation, a potential which is more negative than voltage source 10 is normally applied to input conductor 11 thereby back-biasing the emitter base junction of transistor 4 and causing it to be nonconductive. Due to the nonconduction of transistor 4, the negative potential from voltage source 10 forward biases the emitter-base junction of transistor 6 and conditions it for conduction. The resulting negative potential (−V) at the collector of transistor 6 is reflected through conductors 14 and 32 to maintain transistor 22 in a nonconductive state. On the other hand, due to the nonconductive state of transistor 4, its collector potential is high (+V) and is reflected through conductors 12 and 30 to maintain transistor 24 in a conductive state. Thus, with the normal negative input applied to conductor 11, transistors 4 and 22 are nonconductive and transistors 6 and 24 are conductive. In this state of operation, positive supply 20 supplies currents $I_6+I_{24}$ to transistors 6 and 24, respectively. This causes the potentials at terminals 36 and 34 to be positive and negative, respectively.

Upon the appearance of an input signal, input conductor 11 is caused to go positive, thereby rendering transistor 4 conductive and raising the emitter potential of transistor 6. The emitter-base junction of transistor 6 is thereby back biased and it becomes nonconductive. The resulting negative and positive voltage shifts on conductors 12 and 14, respectively, are reflected through conductors 30 and 32 to the bases of transistors 24 and 22. In response to this action, transistor 24 becomes nonconductive and transistor 22 conductive. The conduction of transistors 4 and 22 allows the current $I_4+I_{22}$ to flow causing the positive (complement) output at terminal 36 to fall. Since transistors 6 and 24 are now nonconductive, no current flows in conductor 14 and output terminal 34 (true) rises in potential.

Figure 2:
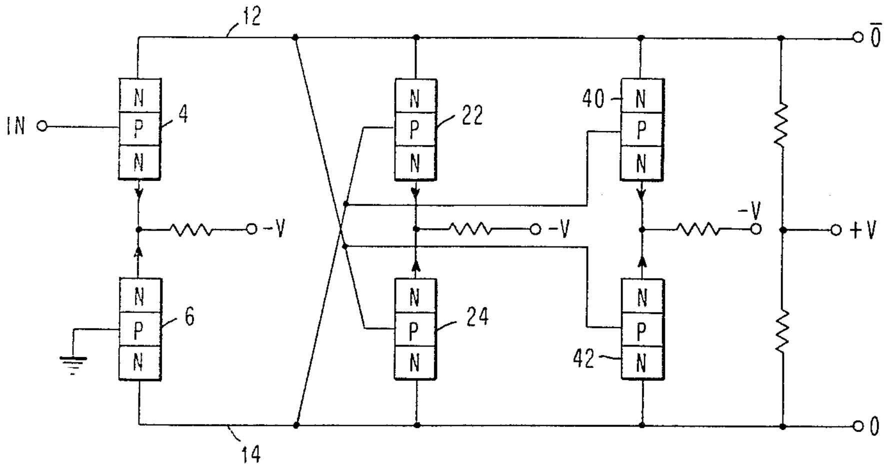
FIG. 2 is a circuit diagram of a further embodiment of the invention which has higher power handling capabilities.

Referring now to FIG. 2, there is shown an alternative version of the basic circuit of FIG. 1 wherein a third current switch has been placed between output conductors 12 and 14 to increase the power handling capabilities of the circuit NPN transistors 40 and 42 are connected exactly as transistors 22 and 24, being placed in parallel therewith across output conductors 12 and 14. Thus, when an input signal appears, transistors 4, 22 and 40 are rendered conductive with a resulting commensurate increase in power handling capabilities. Additional parallel current switches may be added as needed. It should now be obvious that not only do these power drivers achieve the operational speed advantage of the current switch, but also require relatively small exciting currents to produce high power outputs. In both circuits current for only one base is required to produce a full power output.

While the invention has been particularly shown and described with reference to preferred embodiments thereof, it will be understood by those skilled in the art that the foregoing and other changes in form and details may be made therein without departing from the spirit and scope of the invention. For instances, while all of the transistors in the illustrated circuits are shown as NPN junction types, PNP transistors could be substituted therefor with appropriate changes in bias supplies.

I claim:

1. In a power driver circuit, the combination comprising:

first and second potential sources;

a plurality of current switches, each said current switch including first and second transistors, the emitters of said first and second transistors being connected in common to said first potential source and the collectors of said first and second transistors being connected respectively in common through impedance means to said second potential source;

input means connected to a first transistor of one of said current switches, and adapted to normally maintain said transistor in a first conductive state except when an input signal appears and then to cause said transistor to switch to an opposite conductivity state;

a source of reference potential connected to the base of said second transistor in said one current switch, said second transistor thereby being biased for conduction when said first transistor is nonconductive, and for nonconduction when said first transistor is conductive; and circuit means interconnecting the collectors of said first and second transistors of said one current switch with said second and first transistors respectively in a second current switch, said circuit means being responsive to the conductive states of said first and second transistors to divert current from said second potential source to cause said first transistors of said current switches and said second transistors of said current switches to assume identical conductivity states respectively.

2. In a power driver circuit, the combination somprising:

first and second potential sources;

a plurality of current switches, each said current switch including first and second transistors, the emitters of said first and second transistors being connected in common to said first potential source and the collectors of said first and second transistors being connected respectively in common through impedance means to said second potential source;

input means connected to the base circuit of a first transistor of one of said current switches, and adapted to normally maintain said transistor in a first conductive state except when an input signal appears and then to cause said transistor to switch to an opposite conductivity state;

a source of reference potential connected to the base circuit of said second transistor in said one current switch, said second transistor thereby being biased for conduction when said first transistor is nonconductive, and for nonconduction when said first transistor is conductive; and circuit means interconnecting the collectors of said first and second transistors of said one current switch with the base circuit of second and first transistors respectively in a second current switch, said circuit means being responsive to the conductive states of said first and second transistors in said one current switch to divert current from said second potential source to cause said first transistors and second transistors of both said current switches to assume identical conductivity states, respectively.

3. The invention as defined in claim 2 wherein said circuit means interconnects the collectors of said first and second transistors of said one current switch with the base circuits of second and first transistors respectively in all other current switches, said circuit means being responsive to the conductive states of said first and second transistors to divert current from said second potential source to cause said first transistors and second transistors of all said current switches to assume identical conductivity states, respectively.

4. A switching circuit comprising a first current switch including first and second transistors each having an emitter, a collector and a base, a first constant-current source connected to said emitters, means for applying an input signal to the base of the first transistor, means for applying a reference potential to the base of the second transistor, a second current switch including third and fourth transistors each having an emitter, a collector and a base, a second constant-current source connected to said emitters of said second current switch, an out-of-phase output terminal and an in-phase output terminal, means connecting the collectors of the first and third transistors to said out-of-phase output terminal, means connecting the collectors of said second and fourth transistors to said in-phase output terminal, conductive means drivingly connecting the collector of the first transistor to the base of the fourth transistor, and conductive means drivingly connecting the collector of the second transistor to the base of the third transistor.

References Cited

UNITED STATES PATENTS

| | | | |
|---|---|---|---|
| 2,964,652 | 12/1960 | Yourke | 307—88.5 |
| 3,003,071 | 10/1961 | Henle | 307—88.5 |
| 3,019,351 | 1/1962 | Pomerene et al. | 307—88.5 |
| 3,118,073 | 1/1964 | Walsh | 307—88.5 |
| 3,177,374 | 4/1965 | Simonian et al. | 307—88.5 |

ARTHUR GAUSS, *Primary Examiner.*

S. D. MILLER, *Assistant Examiner.*